(12) United States Patent
Singh et al.

(10) Patent No.: US 11,189,557 B2
(45) Date of Patent: Nov. 30, 2021

(54) HYBRID PACKAGE

(71) Applicant: NXP USA, Inc., Austin, TX (US)

(72) Inventors: Akhilesh Kumar Singh, Austin, TX (US); Nishant Lakhera, Austin, TX (US); Chee Seng Foong, Austin, TX (US)

(73) Assignee: NXP USA, INC., Austin, TX (US)

( * ) Notice: Subject to any disclaimer, the term of this patent is extended or adjusted under 35 U.S.C. 154(b) by 99 days.

(21) Appl. No.: 16/791,817

(22) Filed: Feb. 14, 2020

(65) Prior Publication Data
US 2020/0185319 A1 Jun. 11, 2020

Related U.S. Application Data

(62) Division of application No. 16/030,108, filed on Jul. 9, 2018, now abandoned.

(51) Int. Cl.
*H01L 23/498* (2006.01)
*H01L 21/48* (2006.01)

(52) U.S. Cl.
CPC .... *H01L 23/49861* (2013.01); *H01L 21/4839* (2013.01); *H01L 21/4842* (2013.01); *H01L 21/4853* (2013.01); *H01L 23/49816* (2013.01)

(58) Field of Classification Search
CPC ........... H01L 23/49861; H01L 21/4839; H01L 21/4842; H01L 21/4853; H01L 23/49816
See application file for complete search history.

(56) References Cited

U.S. PATENT DOCUMENTS

| 6,261,869 | B1 | 7/2001 | Radford et al. |
| 6,337,510 | B1 | 1/2002 | Chun-Jen et al. |
| 7,687,892 | B2 | 3/2010 | Espiritu et al. |
| 8,288,847 | B2 | 10/2012 | Huang et al. |
| 2004/0124228 | A1 | 7/2004 | Chang |
| 2006/0102994 | A1 | 5/2006 | Pu |
| 2007/0254409 | A1 | 11/2007 | Yip |
| 2009/0127686 | A1 | 5/2009 | Yang et al. |
| 2011/0068458 | A1 | 3/2011 | Camacho et al. |

(Continued)

FOREIGN PATENT DOCUMENTS

CN 109524389 A * 3/2019 ......... H01L 21/4842

OTHER PUBLICATIONS

Sainio, A. et al. "Stacking solves DRAM supply challenges and unique application requirements", 3 pgs., retrieved from the Internet Jul. 6, 2018 at: https://www.embedded.com/print/4207657 (Sep. 14, 2011).

(Continued)

Primary Examiner — Peter Bradford

(57) ABSTRACT

A method of manufacturing a hybrid package including a flat package and a Wafer Level Chip Scale Package (WLCSP) is disclosed. The method includes fabricating a strip including a plurality of flat packages attached to each other via metal pins, turning the strip upside down, applying a layer of a thermal interface material (TIM) on each of the flat packages while the each of the flat packages is turned upside down, mounting the WLCSP on the layer of the TIM such that a top side of the WLCSP is interfaced with the layer of the TIM, curing the layer of the TIM and singulating each of the flat packages by cutting the metal pins and bending the metal pins.

6 Claims, 2 Drawing Sheets

(56) References Cited

U.S. PATENT DOCUMENTS

| | | | |
|---|---|---|---|
| 2011/0157852 A1* | 6/2011 | Ikemoto | H05K 7/06 |
| | | | 361/767 |
| 2012/0020040 A1 | 1/2012 | Lin et al. | |
| 2014/0252573 A1* | 9/2014 | Lin | H01L 24/19 |
| | | | 257/666 |
| 2015/0145130 A1 | 5/2015 | Lin et al. | |
| 2017/0278825 A1 | 9/2017 | Lakhera et al. | |
| 2017/0347174 A1 | 11/2017 | Chandrasekaran | |
| 2017/0358510 A1 | 12/2017 | Park et al. | |
| 2018/0115356 A1 | 4/2018 | Jain et al. | |

OTHER PUBLICATIONS

Yuan, C. A. et al. "Design, Analysis, and Development of Novel Three-Dimensional Stacking WLCSP", IEEE Transactions on Advanced Packaging, vol. 28, No. 3, pp. 387-396 (Aug. 2005).

* cited by examiner

HYBRID PACKAGE

CROSS-REFERENCE TO RELATED APPLICATION

This application is a divisional of U.S. patent application Ser. No. 16/030,108, filed Jul. 9, 2018, which is incorporated by reference herein in its entirety.

BACKGROUND

An electronic circuit fabricated on a silicon wafer is typically packaged inside a insulator material to protect the circuit and also to provide connecting leads to enable the circuit be attached to a printed circuit board (PCB). Different types of packaging are used depending upon intended use.

Quad Flat Package (QFP) is a surface mount integrated circuit package with "gull wing" leads extending from each of the four sides. FIG. 1 shows a flat package 108. The leads may extend from either two sides or all four sides depending on the lead count necessary for the circuit inside the package.

Wafer Level Chip Scale Package (WLCSP) is another example of packaging in which instead of using protruding leads, solder balls are directly attached to the bottom of the circuit and then a protective coating is typically applied to the other exposed parts of the wafer. The solder balls can then be soldered to the PCB. FIG. 2 shows a WLCSP package 102 affixed to the PCB 104. However, the WLCSP package 102 affixed so to the PCB 104 may not have sufficient mechanical stability to stay in place if there are forces that may push the WLCSP package 102 to any lateral direction. For example, if the PCB 104 is being used in a vehicle, the vibrations or jerks or similar events may cause the WLCSP package 102 to disjoin from the PCB 104 or at least solder balls being misaligned from the joints on the PCB. Therefore, an underfill compound 106 is typically used in the gap between the WLCSP package and the PCB to hold the two together securely. The underfill compound, typically, is a liquid that is annealed after it is poured between the gap. The process of filling the underfill compound can only be performed when the system is being assembled on the PCB, which makes the assembling process complex. In some cases, the annealing process may cause failure in other components on the PCB.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a method of manufacturing a hybrid package including a flat package and a Wafer Level Chip Scale Package (WLCSP) is disclosed. The method includes fabricating a strip including a plurality of flat packages attached to each other via metal pins, turning the strip upside down, applying a layer of a thermal interface material (TIM) on each of the flat packages while the each of the flat packages is turned upside down, mounting the WLCSP on the layer of the TIM such that a top side of the WLCSP is interfaced with the layer of the TIM, curing the layer of the TIM and singulating each of the flat packages by cutting the metal pins and bending the metal pins. The strip can be a lead frame.

In some embodiments, the length of each of the metal pins is greater than height of the WLCSP and a protruding extreme tip of each of the mental pins is at a same plane as a bottom extreme tip of each of solder balls or solder pads. The layer of the TIM uses a material that provides a transfer of heat from the WLCSP to the flat package. The flat package may be of the type quad flat package (QFP).

In another embodiment, a hybrid package manufacturing using the above methods is disclosed.

In yet another embodiment, a device is disclosed. The device includes an integrated circuit packaged as a Wafer Level Chip Scale Package (WLCSP). The WLCSP includes a plurality of solder balls on a bottom side. The device also includes an integrated circuit packaged as a Quad Flat Package (QFP). The QFP includes a plurality of metal pins protruding from each of four sides. The QFP is mounted on the top side of the WLCSP and the QFP is affixed to the WLCSP using a layer of a thermal interface material and the protruding extreme tip of each of the plurality of metal pins is a same plane as bottom extreme tip of each of the plurality of solder balls.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Electronic devices continue to be smaller in physical dimensions year by year. Yet there is a market need to pack more features in the same or smaller space. To save lateral space on a PCB, components such as integrated circuits are now stacked up in Z direction. A three-dimensional integrated circuit (3D IC) is an integrated circuit manufactured by stacking silicon wafers or dies and interconnecting them vertically using, for instance, through-silicon vias (TSVs) or Cu—Cu connections, so that they behave as a single device to achieve performance improvements at reduced power and smaller footprint than conventional two dimensional processes. 3D IC is just one of a host of 3D integration schemes that exploit the z-direction to achieve electrical performance benefits. However, since all components in 3D IC are fabricated on a same wafer, 3D IC are not suitable to combine certain types of sub-systems in the same 3D IC. For example, it may not be desirable to stack a microwave or high frequency sub-system with a sub-system that may be sensitive to high frequency noise or emissions.

Embodiments described herein provides stacking different types of packages to save lateral space on the PCB. In addition, the combined package relieves the need for using an underfill to adhere an underlying package to the PCB to provide mechanical stability and board level reliability. Furthermore, since the two packages being combined are fabricated and packaged separately on separate wafers, different types of applications may be combined in a same hybrid package. For example, a high frequency package can be stacked on top of a high frequency noise sensitive package.

Figure 1:
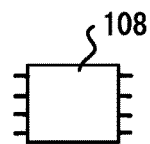
FIG. 1 depicts a schematic of a QFP package with solder balls on a printed circuit board (PCB)
Figure 2:
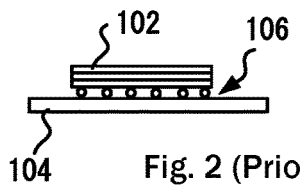
FIG. 2 illustrates a schematic of a WLCSP package with protruding leads of pins.
Figure 3:
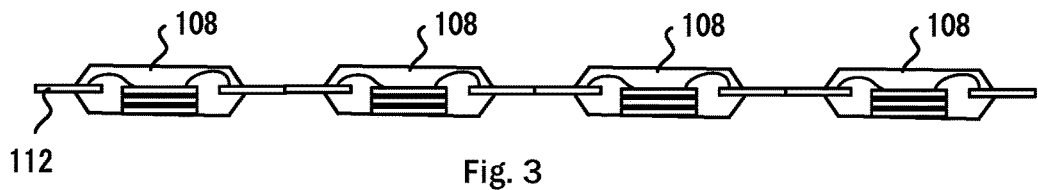
FIGS. 3, 4, 5A, 5B, 6A, 6B show the process steps to manufacture a hybrid package in accordance with one of more embodiments of the present disclosure.

FIG. 3 shows a tape of QFP packages 108 with leads or pins 112 prior to being singulated. The process of manufacturing QFP packages is well known, hence, a detailed description is being omitted. Note that the term "tape" is being used as an example. The tape can be a strip or lead frame that is used during manufacturing of integrated circuits.

Figure 4:
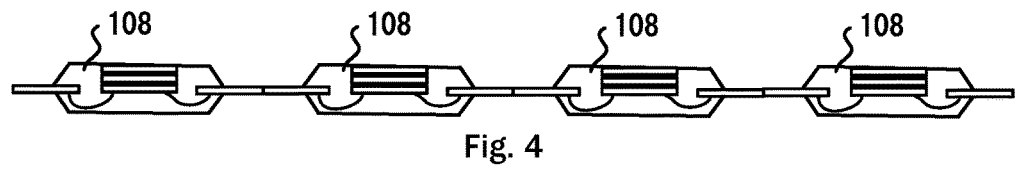
Figure 5A:
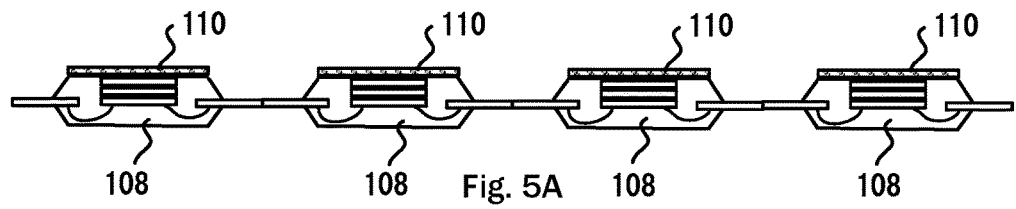
Figure 5B:
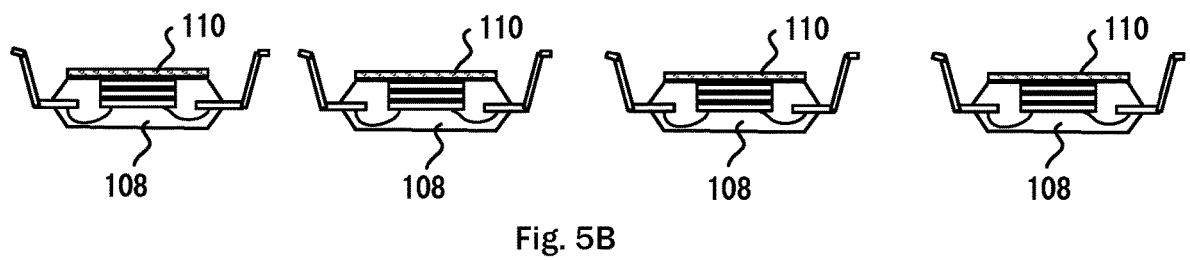
Figure 6A:
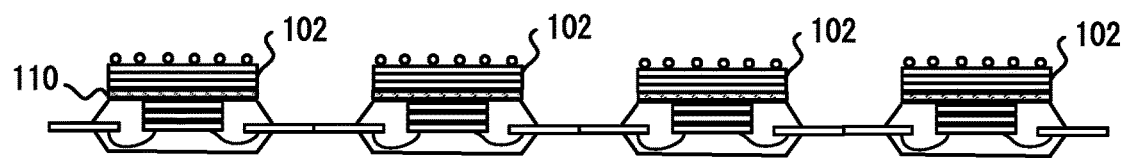
Figure 6B:
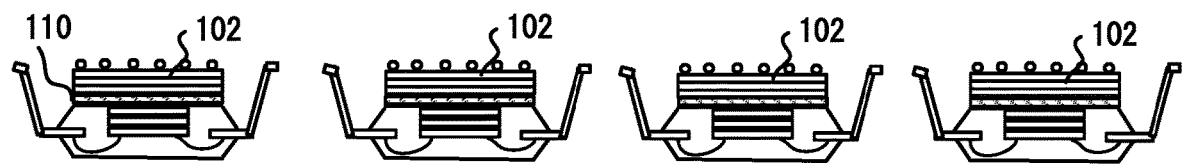
Figure 7:
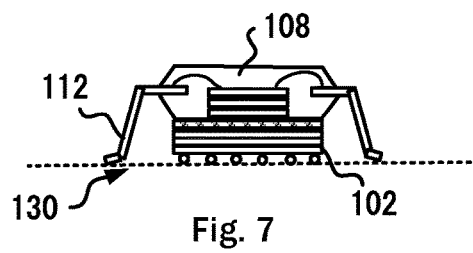
FIG. 7 illustrates that the extreme ends of solder balls and metal pins are at a same plane.

FIG. 4 shows the tape of QFP packages 108 upside down. After turning the tape upside down, as shown in FIG. 5A, a layer of thermal interface material (TIM) 110 is applied on the bottom side of QFP packages 108. In some embodiments, as shown in FIG. 5A, QFP packages may be singulated by cutting the pins 112 prior to proceeding to the next step. In some embodiments, the TIM lawyer 110 may be applied after sigulating QFP packages. QFP packages still remain connected via the lead frame or strip. As shown in FIG. 6A, the WLCSP package 102 is mounted, with solder balls or pads facing up, on the TIM layer 110. The TIM layer 110 is cured so that the WLCSP package 102 is firmly affixed to the QFP package 108. In some embodiments, an adhesive tape may be used instead of a material that requires curing. FIG. 6B shows the same step as FIG. 6A if the step of FIG. 5B was followed.

The TIM layer 110 enables channeling stress and heat from the WLCSP package 102 towards the top when the hybrid package, as described here, is surface mounted on the PCB 104. In some embodiments, a heat sink may be mounted on top of the QFP package 108 after the hybrid package is surface mounted on the PCB 104. In some examples, depending on the size of the WLCSP package 102, the pins 112 of the QFP package 108 may be made wider to provider better mechanical stability to the hybrid package that includes the QFP package 108 and the WLCSP package 102. Each of the pins 112 is longer than the height of the WLCSP package 102 to enable the protruding end of each of the pins 112 to reach the top surface of the PCB 104 when the hybrid package is mounted on the PCB 104. The extreme tip of the protruding pin is in a same plane 130 as the bottom extreme tip of a solder ball that is affixed to the WLCSP package 102. In some embodiments, an adhesive material such as epoxy may be used instead of the thermal interface material in the layer 110.

Figure 8:
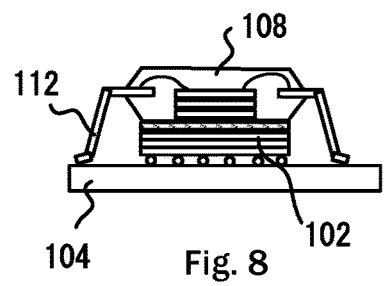
FIG. 8 illustrates the hybrid package on a PCB in accordance with one of more embodiments of the present disclosure.

After mounting the WLCSP package 102 on the TIM layer 110, the hybrid packages are singulated and pins 112 protruding from the QFP packages 108 are bent. FIG. 8 shows an example of the hybrid package mounted on the PCB 104. As apparent, the pins 112 are actually soldered to the PCB 104, hence the pins 112 provide mechanical stability to the hybrid package on the PCB 104. It should be noted that the size of the WLCSP package 102 may be larger than the QFP package 108. In such examples, the pins 112 need to be made longer so they can reach the PCB 104 around the sides of the WLCSP package 102. It should be noted that even though the term QFP package is used to describe the embodiments, the embodiments also apply to flat packages with two side pins too.

Figure 9A:
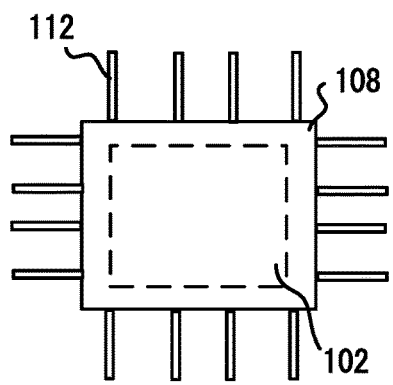
FIGS. 9A, 9B show top and bottom views of the hybrid pakage.
Figure 9B:
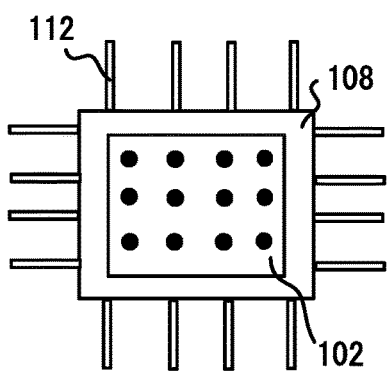

FIG. 9A shows the top view of the hybrid packages manufactured using the steps shown in FIG. 3 to FIG. 7. As shown, horizontal dimensions of the hybrid package are the same as the horizontal dimension of the bigger of the QFP package 108 or the WLCSP package 102. FIG. 9B shows the bottom view of the hybrid package. As shown, solder balls are exposed at the bottom side.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A method of manufacturing a hybrid package including a flat package and a Wafer Level Chip Scale Package (WLCSP), the method comprising:
   (a) fabricating a strip including a plurality of flat packages attached to each other via metal pins;
   (b) turning the strip upside down;
   (c) applying a layer of a thermal interface material (TIM) on each of the flat packages while the each of the flat packages is turned upside down;
   (d) mounting the WLCSP on the layer of the TIM such that a top side of the WLCSP is interfaced with the layer of the TIM, wherein a bottom side of the WLCSP includes a plurality of solder balls or solder pads; (e) curing the layer of the TIM; and
   (f) singulating each of the flat packages by cutting the metal pins and bending the metal pins.

2. The method of claim 1, wherein length of each of the metal pins is greater than height of the WLCSP.

3. The method of claim 1, wherein a protruding extreme tip of each of the mental pins is at a same plane as a bottom extreme tip of each of solder balls or solder pads.

4. The method of claim 1, wherein the layer of the TIM uses a material that provides a transfer of heat from the WLCSP to the flat package.

5. The method of claim 1, wherein the flat package is of type quad flat package (QFP).

6. The method of claim 1, wherein the strip is a lead frame.

* * * * *